United States Patent
Harris et al.

(10) Patent No.: US 6,846,724 B2
(45) Date of Patent: Jan. 25, 2005

(54) METHOD FOR FABRICATING A MICROELECTROMECHANICAL SYSTEM (MEMS) DEVICE USING A PRE-PATTERNED BRIDGE

(75) Inventors: Richard D. Harris, Solon, OH (US); Robert J. Kretschmann, Bay Village, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 10/841,649

(22) Filed: May 7, 2004

(65) Prior Publication Data

US 2004/0209413 A1 Oct. 21, 2004

Related U.S. Application Data

(62) Division of application No. 09/967,157, filed on Sep. 28, 2001, now Pat. No. 6,794,271.

(51) Int. Cl.[7] .......................... H01L 21/30; H01L 21/00
(52) U.S. Cl. ........................ 438/455; 438/53; 438/456
(58) Field of Search ................................ 438/455, 456, 438/50, 52, 53, 379

(56) References Cited

U.S. PATENT DOCUMENTS

| | | | |
|---|---|---|---|
| 3,886,447 A | | 5/1975 | Tanaka |
| 4,513,348 A | * | 4/1985 | Grantham ................ 361/283.1 |
| 4,560,953 A | | 12/1985 | Bozio |
| 4,625,561 A | * | 12/1986 | Mikkor ........................ 73/724 |
| 5,012,207 A | | 4/1991 | Edwards |
| 5,025,346 A | | 6/1991 | Tang et al. |
| 5,194,819 A | | 3/1993 | Briefer |
| 5,243,861 A | | 9/1993 | Kloeck et al. |
| 5,335,550 A | * | 8/1994 | Satou .......................... 73/727 |
| 5,343,157 A | | 8/1994 | Deschamps |

(List continued on next page.)

FOREIGN PATENT DOCUMENTS

| | | |
|---|---|---|
| EP | 0 665 590 A2 | 8/1995 |
| EP | 0 711 029 A2 | 5/1996 |
| EP | 0 763 844 A1 | 3/1997 |

OTHER PUBLICATIONS

Storment, C.W., et al. "Flexible, Dry–Released Process for Aluminum Electrostatic Actuators," Journal of Microelectromechanical Systems, 3(3), Sep. 1994, p 90–96.
U.S. Appl. No. 09/406,654, filed Sep. 27, 1999.
U.S. Appl. No. 09/400,125, filed Sep. 21, 1999.

(List continued on next page.)

Primary Examiner—Michael Trinh
(74) Attorney, Agent, or Firm—Quarles & Brady LLP; R. Scott Speroff

(57) ABSTRACT

A method for fabricating MEMS structures includes etching a recess in either an upper surface of a substrate that is bonded to a wafer that ultimately forms the MEMS structure, or to the lower surface of the wafer that is bonded to the substrate. Accordingly, once the etching processes of the wafer are completed, the recess facilitates the release of an internal movable structure within the fabricated MEMS structure without the use of a separate sacrificial material. Furthermore, a bridge, which is preferably insulating, is pre-etched before the wafer is attached to the substrate.

41 Claims, 8 Drawing Sheets

U.S. PATENT DOCUMENTS

| | | |
|---|---|---|
| 5,359,893 A | 11/1994 | Dunn |
| 5,413,668 A | 5/1995 | Aslam et al. |
| 5,417,312 A | 5/1995 | Tsuchitani et al. |
| 5,424,650 A | 6/1995 | Frick |
| 5,491,604 A | 2/1996 | Nguyen et al. |
| 5,536,988 A | 7/1996 | Zhang et al. |
| 5,563,343 A | 10/1996 | Shaw et al. |
| 5,578,976 A | 11/1996 | Yao |
| 5,585,311 A | 12/1996 | Ko |
| 5,600,190 A | 2/1997 | Zettler |
| 5,646,432 A | 7/1997 | Iwaki et al. |
| 5,658,698 A | 8/1997 | Yagi et al. |
| 5,761,350 A | 6/1998 | Koh |
| 5,783,340 A | 7/1998 | Farino et al. |
| 5,798,283 A | 8/1998 | Montague et al. |
| 5,804,314 A | 9/1998 | Field et al. |
| 5,815,051 A | 9/1998 | Hamasaki et al. |
| 5,834,864 A | 11/1998 | Hesterman et al. |
| 5,888,845 A * | 3/1999 | Bashir et al. ............... 438/53 |
| 5,903,380 A | 5/1999 | Motamedi et al. |
| 5,920,978 A | 7/1999 | Koshikawa et al. |
| 5,943,155 A | 8/1999 | Goossen |
| 5,955,932 A | 9/1999 | Nguyen et al. |
| 5,959,516 A | 9/1999 | Chang et al. |
| 5,995,688 A | 11/1999 | Aksyuk et al. |
| 6,046,066 A | 4/2000 | Fang et al. |
| 6,060,336 A | 5/2000 | Wan |
| 6,071,426 A | 6/2000 | Lee et al. |
| 6,094,102 A | 7/2000 | Chang et al. |
| 6,100,477 A | 8/2000 | Randall et al. |
| 6,114,794 A | 9/2000 | Dhuler et al. |
| 6,116,756 A | 9/2000 | Peeters et al. |
| 6,127,767 A | 10/2000 | Lee et al. |
| 6,137,206 A | 10/2000 | Hill |
| 6,144,545 A | 11/2000 | Lee et al. |
| 6,149,190 A | 11/2000 | Galvin et al. |
| 6,159,385 A | 12/2000 | Yao et al. |
| 6,170,332 B1 | 1/2001 | MacDonald et al. |
| 6,188,322 B1 | 2/2001 | Yao et al. |
| 6,232,150 B1 | 5/2001 | Lin et al. |
| 6,232,841 B1 | 5/2001 | Bartlett et al. |
| 6,232,847 B1 | 5/2001 | Marcy, 5th et al. |
| 6,236,281 B1 | 5/2001 | Nguyen et al. |
| 6,257,705 B1 | 7/2001 | Silverbrook |
| 6,265,238 B1 | 7/2001 | Yaji et al. |
| 6,307,169 B1 | 10/2001 | Sun et al. |
| 6,373,682 B1 | 4/2002 | Goodwin-Johansson |
| 6,384,353 B1 | 5/2002 | Huang et al. |
| 6,400,009 B1 | 6/2002 | Bishop et al. |
| 6,411,214 B1 | 6/2002 | Yao et al. |
| 6,417,743 B1 | 7/2002 | Mihailovich et al. |
| 6,463,339 B1 | 10/2002 | Vasko |
| 6,465,929 B1 | 10/2002 | Levitan et al. |
| 6,466,005 B1 | 10/2002 | Yao et al. |
| 6,497,141 B1 | 12/2002 | Turner et al. |
| 6,504,356 B2 | 1/2003 | Yao et al. |

OTHER PUBLICATIONS

U.S. Appl. No. 09/406,509, filed Sep. 28, 1999.
U.S. Appl. No. 09/955,493, filed Sep. 18, 2001.
U.S. Appl. No. 09/955,494, filed Sep. 18, 2001.
U.S. Appl. No. 09/675,861, filed Sep. 29, 2000.
Boser, Bernhard E. et al., Surface Micromachined Accelerometers, IEEE J. of Solid–State Circuits, V. 31 (3) 366–375, Mar. 1996.
Fedder, Gary K. et al., Multimode Digital Control of a Suspended Polysilicon Microstructure, J. of Microelectromechanical Sys., V. 5 (4) 283–297, Dec. 1996.
Noriega, Gerardo, Sigma–Delta A/D Converters–Audio and Medium Bandwidths, Technical Notes–DT3 from RMS Instruments website: www.rmsinst.com, 6 pages, Feb. 1996.
Internet page: Decimator Filter DLL, NeuroDimension Inc.: www.nd.com , May 31, 2001, 1 page.
Toumazou, C. et al., n–step Charge Injection Cancellation Scheme for Very Accurate Switched Current Circuits, Electronic Letters, V.30 (9) 680–681: 1994.
Emmerich, H., et al., A Novel Micromachined Magnetic–Field Sensor, MEMS 99 IEEE Conference, Jan. 17–21, 1999, IEEE Catalog No. 99ch36291c.
Madou, Marc, Fundamentals of Microfabrication, Chapters 2–4, CRC Press LLC, Boca Raton, FL: 1997.
Kovacs, Gregory T.A., Micromachined Transducers Sourcebook, Table of Contents, pp. 77–119 and Index, WCB McGraw–Hill, U.S.A.: 1998.
Teegarden, Darrell et al., How to Model and Simulate Microgyroscope Systems, IEEE Spectrum, 66–75, Jul. 1998.
Emmerich, Harald et al., Magnetic Field Measurements with a Novel Surface Micromachined Magnetic–Field Sensor, IEEE Transactions on Electron Devices, V. 47 (5) 972–977, May 2000.
McGruer, N.E. et al., Electrostatically Actuated Microswitches; Scaling Properties, Solid–State Sensor and Actuator Workshop, Hilton Head Island, South Carolina, Jun. 8–11, 1998, pp. 132–135.
Miyajima, Hiroshi et al., High–Aspect–Ratio Photolithography for MEMS Applications, J. of Microelectromechanical Sys., V.4(4) 220–229, Dec. 1995.
Lu, Crist et al., A Monolithic Surface Micromachined Accelerometer with Digital Output, IEEE J. of Solid State Circuits, V. 30 (12) 1367–1373, Dec. 1995.
Chen, Ming–Jer et al., Weak Inversion Charge Injection in Analog MOS Switches, IEEE J. of Solid–State Circuits, V. 30 (5) 604–606, May 1995.
Lemkin, Mark A. et al., A Fully Differential Lateral S? Accelerometer with Drift Cancellation Circuitry, Solid–State Sensor and Actuator Workshop, Hilton Head, South Carolina, Jun. 2–6, 1996, pp. 90–93.

* cited by examiner

METHOD FOR FABRICATING A MICROELECTROMECHANICAL SYSTEM (MEMS) DEVICE USING A PRE-PATTERNED BRIDGE

CROSS-REFERENCE TO RELATED APPLICATIONS

This is a divisional patent application of U.S. patent application Ser. No. 09/967,157 filed Sep. 28, 2001, U.S. Pat. No. 6,794,271, and claims priority thereto.

BACKGROUND OF THE INVENTION

1. Field of the Invention

The present invention relates to microelectromechanical systems (MEMS) and, in particular, relates to the fabrication of MEMS structures.

2. Discussion of the Related Art

Microelectromechanical systems (MEMS) components are being progressively introduced into many electronic circuit as well as micro-sensor applications. Examples of MEMS components are electromechanical motors, radio frequency (RF) switches, high Q capacitors, pressure transducers and accelerometers. In one application, the MEMS device is an accelerometer having a movable component that, in response to an external stimulus, is actuated so as to vary the size of a capacitive air gap. Accordingly, the capacitance output of the MEMS device provides an indication of the strength of the acceleration.

When the MEMS device is an accelerometer, the device comprises a stationary MEMS element that is attached to a nonconductive substrate, and a movable MEMS element that has a substantial portion that is free from mechanical contact with the substrate that is therefore movable with respect to the stationary element.

One method of fabricating such components, often referred to as surface micro-machining, uses a sacrificial layer, such as silicon dioxide, that is deposited and bonded onto a substrate, such as single crystal silicon which has been covered with a layer of silicon nitride. A MEMS component material, for example polycrystalline silicon, is then deposited onto the sacrificial layer, followed by a suitable conductor, such as aluminum, to form an electrical contact with the ambient environment. The silicon layer is then patterned by standard photolithographic techniques and then etched by a suitable reactive ion etching plasma or by wet chemistry to define the MEMS structure and to expose the sacrificial layer, which may comprise silicon dioxide. The sacrificial layer is then etched to release the MEMS component.

Several disadvantages are associated with fabricating a MEMS device using a sacrificial layer. First, it requires the availability of an etching process that is capable of selectively etching the sacrificial layer without reacting with the other materials that will ultimately form the MEMS device. This limits the materials that may be used when fabricating the MEMS device. Additionally, the use of a sacrificial layer increases the amount of materials needed to form the MEMS device, thereby adding cost and complexity to the fabrication process. Furthermore, an additional etching step is needed to remove the sacrificial layer, thereby further reducing the efficiency of the fabrication process. In particular, because the structure forming the movable MEMS element is disposed on top of the sacrificial layer, a significant amount of time is needed to completely undercut the sacrificial layer. In fact, in some instances, holes are first etched through the base of the movable MEMS element in order to permit the etchant to access the sacrificial layer.

What is therefore needed is an improved reliable method for manufacturing isolated MEMS devices using simplified etching processes that avoids the disadvantages associated with undercutting a sacrificial layer to release the movable MEMS element.

BRIEF SUMMARY OF THE INVENTION

The present invention recognizes that a MEMS structure may be fabricated using an internal void to release the movable MEMS element without using a sacrificial layer. Furthermore, the fabrication process may be made more reliable by pre-patterning a bridge that provides the base of the movable MEMS element.

In accordance with one aspect of the invention, a method of fabricating a MEMS structure, comprises the steps of 1) providing a wafer having at least a first layer and a second layer, 2) removing a portion of the first layer to form a bridge member, 3) subsequently attaching the wafer to the upper surface of the substrate to form a composite structure having an internal void formed therein, wherein the bridge member is aligned with the internal void, and 4) etching through the upper layer wafer around the periphery of the bridge member to break through into the recess, thereby releasing the bridge from the substrate.

These and other aspects of the invention are not intended to define the scope of the invention for which purpose claims are provided. In the following description, reference is made to the accompanying drawings, which form a part hereof, and in which there is shown by way of illustration, and not limitation, a preferred embodiment of the invention. Such embodiment does not define the scope of the invention and reference must be made therefore to the claims for this purpose.

BRIEF DESCRIPTION OF THE DRAWINGS

Reference is hereby made to the following figures in which like reference numerals correspond to like elements throughout, and in which.

DETAILED DESCRIPTION OF THE INVENTION

Figure 1:
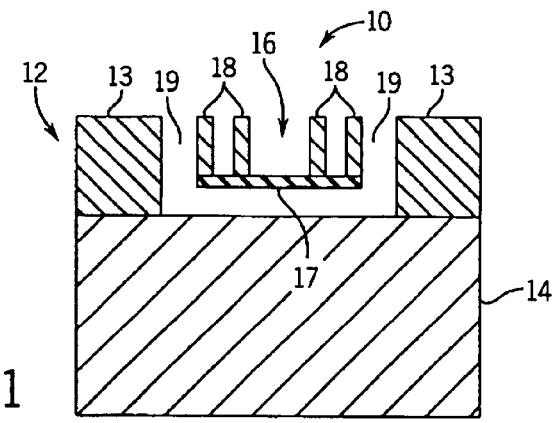
FIG. 1 is a schematic sectional side elevation view of a MEMS device constructed in accordance with one embodiment.

Referring initially to FIG. 1, a schematic illustration of a MEMS device 10 includes a stationary MEMS element 12, which comprises a pair of stationary outer conductive members 13 extending upwardly from a substrate 14. The substrate 14 may be either conducting or insulating, depending on the intended application, and may comprise glass, high resistivity silicon, crystalline sapphire, crystalline silicon, polycrystalline silicon, silicon carbide, or ceramic such as alumina, aluminum nitride, and the like, or gallium arsenide. In fact, the substrate may comprise any material whatsoever that is suitable for supporting a MEMS device. An inner movable MEMS element 16 is disposed between the pair of stationary members 13, and includes a bridge 17 supporting two pairs of separated conductive elements 18 that extend upwardly from the base.

It should be appreciated by those having ordinary skill in the art that movable MEMS element 16 is a beam that is supported at its distal ends by, for example, the substrate such that the middle portion of element 16 is free and movable relative to the stationary members 13. Such an arrangement is described, for example in a U.S. patent application Ser. No. 09/805,410 filed on Mar. 13, 2001 and entitled "Microelectricalmechanical System (MEMS) Electrical Isolator with Reduced Sensitivity to Internal Noise" the disclosure of which is hereby incorporated by reference. The outer two elements 13 are separated from moveable MEMS element 16 by a variable size gap 19, which could be the gap between the adjacent plates of a detection capacitor, as will become more apparent from the description below.

The MEMS device 10 could therefore perform any function suitable for a MEMS application. For example, the device could comprise an accelerometer whose movable MEMS element 16 is a beam that deflects in response to the external stimulus, such as an acceleration or vibration of the device 10. Accordingly, as the size of the gaps 19 vary, so will the output capacitance, thereby providing a measurement of the amount of deflection of the movable MEMS element 16. A measurement of the amount of acceleration may thereby be obtained by measuring the capacitance of the device. The device 10 constructed in accordance with the present invention could further incorporate a wafer level cap and electrical traces connected to the stationary members 13, as described in U.S. patent application Ser. No. 09/842,975 and entitled "Method for Fabricating an Insolated Microelectromechanical System (MEMS) Device Incorporating a Wafer Level Cap" filed on Apr. 26, 2001, the disclosure of which is hereby incorporated by reference as if set forth in its entirety herein.

If bridge 17 is formed utilizing an insulating material, as is the case in accordance with the preferred embodiment, the conductive elements 18 become electrically isolated from each other, thereby minimizing the risk that an electrical input will conduct across the device 10, which would jeopardize those elements disposed downstream of the MEMS output.

The MEMS device 10 may be fabricated in accordance with several embodiments that utilize an internal void to release the movable MEMS element 16 from the substrate 14 and stationary elements 13, as will now be described.

These methods provide for the release of the movable MEMS element without the need to undercut a sacrificial layer. It has recently been discovered that in certain MEMS applications, it is desirable for the device to achieve a high level of electrical isolation to prevent components downstream of the MEMS device from shorting due to excessive electrical voltage or current. Also, instrumentation systems can gain significant benefit from having electrical isolation between the sensed quantity and sensitive measurement electronics. Accordingly, an insulating layer (or bridge) has been integrated into the MEMS component that forms the base of the movable MEMS element and, as such, has conventionally been the last layer to be etched prior to release of the movable element. However, it has been found that the insulating layer tends to break, crack, or otherwise fail due to the stresses incurred at portions of the bridge that are disposed between the stationary and movable MEMS elements prior to the final etching step. As a result, mass production of such MEMS devices has been inefficient and expensive. A MEMS device is thus constructed having a pre-etched bridge, as will now be described.

Figure 2:
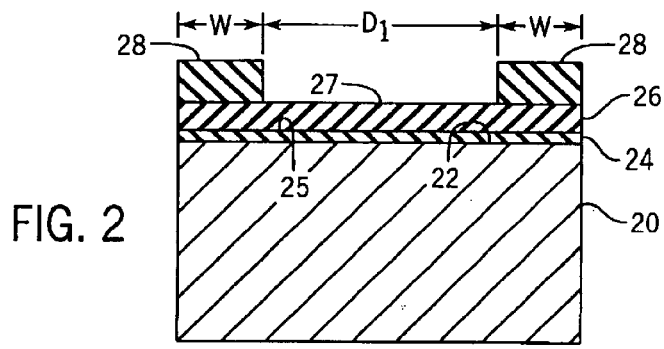
FIG. 2 is a sectional side elevation view of a wafer having a first bridge layer and a second layer deposited thereon, and having photoresist deposited thereon and patterned, and usable to fabricate a MEMS device in accordance with one embodiment.

In particular, referring now to FIG. 2, a wafer 20, which is conducting and comprises silicon in accordance with one embodiment, includes a first layer 24 deposited onto the upper surface 22 thereof. The first layer 24 is insulating, comprising silicon dioxide ($SiO_2$), and will ultimately form a bridge 17 for the movable MEMS element 16, as will be described in more detail below. The oxide layer 24 may be formed by thermal oxidation of the wafer 20, or by depositing a layer of silicon dioxide, for example by using chemical vapor deposition (CVD) or plasma enhanced chemical vapor deposition (PECVD), as is understood by those having ordinary skill in the art.

Alternatively, wafer 20 could comprise a silicon-on-insulator (SOI) wafer. The insulating layer 24 would comprise silicon dioxide that is deposited onto the top surface of the SOI wafer 20 as commercially available. SOI wafers are commercially available having various silicon layer thicknesses, and are thus selected in anticipation of the height of the final MEMS device. A method of etching a SOI wafer is described in U.S. patent application Ser. No. 09/843,563, filed on Apr. 26, 2001 and entitled "Method for Fabricating a Microelectromechanical System (MEMS) Device Using a Pre-patterned Substrate" the disclosure of which is hereby incorporated by reference. An embodiment employing an SOI wafer is described below and illustrated beginning with FIG. 16. It should be appreciated that SOI wafers are commercially available having thicknesses for layer 128 of between 1 and 100 microns. The thickness of layer 126 may vary between, for example, 350 and 750 microns, and can depend on the diameter of the wafer. Such SOI wafers are commercially available, for example, from Shin-Etsu Handotai Co., Ltd., located in Japan.

Next, a second layer 26 is deposited onto the oxide layer 24 using chemical vapor deposition, plasma enhanced chemical vapor deposition, or like method. Because the layer 26 will ultimately provide a spacer that will be used to define an internal void during fabrication, as will be described below, and will not ultimately form part of the inner movable MEMS element 16, this layer could comprise either an insulating or conductive material, so long as it is selectively etchable from the other materials forming the MEMS device 10. The second layer 26 may comprise, for example, either silicon nitride ($Si_3N_4$) or polycrystalline silicon. However, if the substrate 14 (shown in FIG. 5) is conductive, it may be desirable for the second layer 26 to be insulating to achieve electrical isolation for the device 10. Because the layer 24 that will ultimately form the bridge of the fabricated movable MEMS element 16 is insulating, the MEMS device 10 may achieve sufficient electrical isolation. It should be appreciated, however, that layer 24 need not be constructed with an insulating material if electrical isolation is not desired.

It should further be appreciated that the embodiments described herein comprise various layers of conductive and nonconductive materials. While these materials are identified in accordance with the preferred embodiment, it should be appreciated that any alternative materials suitable for use in the intended MEMS application, and that are selectively etchable if necessary, could be substituted for the disclosed materials. For example, layer 24 could be silicon nitride and layer 26 could be silicon dioxide.

A pair of photoresist members 28 is formed by depositing photoresist on the upper surface 27 of the second layer 26 and patterning it using a mask (not shown) in accordance with standard photolithographic techniques. The photoresist 28 is spaced apart by a middle section having a distance $D_1$ which defines the width of an internal void that will facilitate the release of the fabricated inner movable MEMS element, as will become more apparent from the description below. It will become further apparent that the width W of each photoresist member 28 could correspond to the width of the fabricated stationary outer conductive members 13 and, in any event, will define the width of spacer member 29 (shown in FIG. 3) as will now be described.

In particular, the second layer 26 is selectively etched, using either phosphoric acid, $H_3PO_4$ as a wet chemistry etch or a $CF_4$+4% $O_2$ plasma as a dry etch, to remove the portion of silicon nitride that is disposed between the photoresist members 28, while avoiding etching the portion of layer 26 that is disposed directly beneath the photoresist. Accordingly, a pair of spacers 29 is formed on the outer ends of the upper surface 25 of layer 24, defining a recess 30 therebetween whose base is further defined by upper surface 25.

Figure 3:
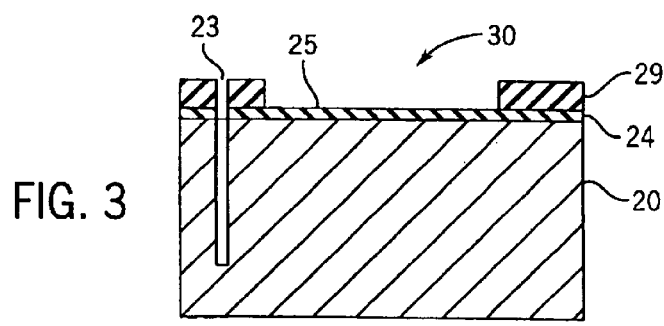
FIG. 3 is a sectional side elevation view of the wafer illustrated in FIG. 2 after etching the second layer, removing the photoresist, reapplying photoresist, patterning, and etching to form an alignment hole through the wafer and removing the photoresist.

Next, referring to FIG. 3, the remaining photoresist 28 is removed to expose the spacers 29. Additional photoresist (not shown) is then applied to the entire upper surface of the wafer, and an opening is formed in the photoresist that is in alignment with one of the spacers 29. Each layer 29, 24, and 20 is subsequently anisotropically etched to form an alignment hole 23 extending through the structure to a depth such that the alignment hole will be visible from both sides after the substrate is subsequently thinned, and that may be used to assist in achieving proper alignment in subsequent etching procedures, as will be described in more detail below. The anisotropic etch may be performed by a process commonly referred to as Deep Reactive Ion Etching (DRIE), which involves setting up a reactive etching environment in a suitably chosen gas by exciting with an inductively coupled plasma (ICP), as is understood by those having ordinary skill in the art. It may be impractical to etch alignment hole 23 through the entirety of layer 20 due to its large thickness. Rather, layer 20 may be etched sufficiently deep such that when this layer is subsequently thinned, the alignment hole is uncovered, as will be described below. Also, if wafer 20 is an SOI wafer, the buried oxide layer may serve as an etch stop to limit the depth of the alignment hole. This is sufficient as the hole will be revealed when the wafer is thinned, as will be described below. It should be easily appreciated by those skilled in the art, however, that many other techniques exist that are sufficient to align a mask on a wafer.

It should be appreciated that layers 24 and 26 exist at least partially because they are selectively etchable with respect to one another. However, it is envisioned that one layer may be partially etched, and in this regard, one layer could be used to provide a bridge as well as a spacer, as would be understood to one having ordinary skill in the art.

Figure 4:
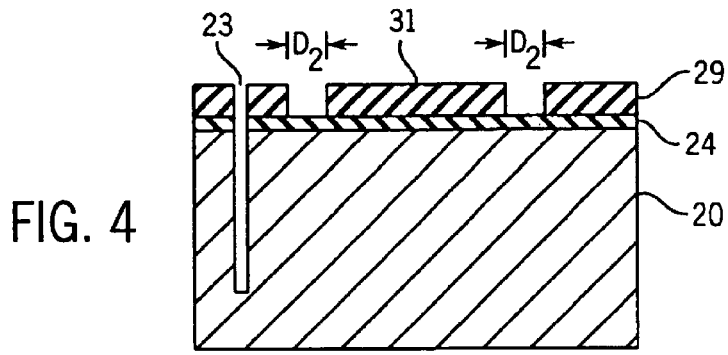
FIG. 4 is a sectional side elevation view of the wafer illustrated in FIG. 3 after having photoresist deposited thereon and patterned to pre-pattern the first layer in accordance with the preferred embodiment.

Next, referring to FIG. 4, layer 24 is pre-etched before attaching the structure onto substrate 14. In particular, photoresist 31 is applied to the entire wafer surface and patterned so as to remain in the middle portion of layer 24 that is disposed between spacers 29, it being appreciated that the silicon dioxide aligned with the photoresist 31 will ultimately define the bridge 17. In particular, remaining photoresist 31 is spaced from spacers 29 by a distance $D_2$ that will ultimately define a variable size gap disposed between the fabricated inner movable MEMS element and the stationary MEMS element. Next, only the portion of layer 24 that is disposed between conductive elements 18 and 13, where it is not protected by the photoresist, is removed by applying to the exposed silicon dioxide an anisotropic etching plasma, such as trifluoro-methane ($CHF_3$), commercially known as fluoroform, in the case where layer 24 comprises silicon dioxide. The photoresist 31 is subsequently removed. While layer 24 could be etched much later in the process, after the wafer had been attached to the substrate 14, it has been determined that the stresses incurred by the bridge 17 are reduced when the bridge is pre-etched, thereby increasing the reliability of the fabrication process.

Figure 5:
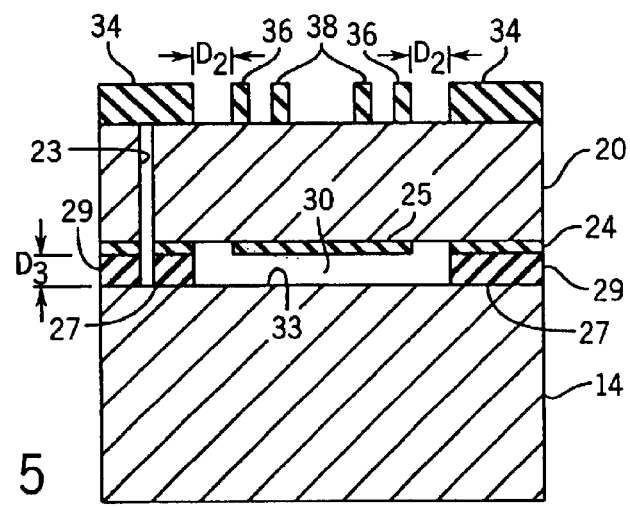
FIG. 5 is a sectional side elevation view of the wafer illustrated in FIG. 4 after selectively etching the bridge layer, removing the photoresist, and subsequently bonding the wafer to a substrate to form a composite structure having an internal void, and thinning the wafer, and after depositing and patterning photoresist onto the composite structure.

Next, referring to FIG. 5, the wafer structure is turned upside down, such that the upper surface 27 of spacers 29 is bonded to the upper surface 33 of the substrate 14 using a high temperature fusion bonding process, an anodic bonding process, or any equivalent process as understood by those having ordinary skill in the art. Accordingly, an internal void 30 is formed that is defined by upper surface 33, spacers 29, wafer 20, and middle portion of layer 24. The height $D_3$ of the spacer member 29 defines the height of the void 30, which should be sufficiently great to allow the release of the inner movable MEMS element 16 without the need to undercut a sacrificial layer that would be disposed beneath the movable MEMS element in accordance with conventional fabrication processes.

Wafer 20 may next be thinned to the desired thickness of the final MEMS device. If the wafer 20 is an SOI wafer, where the top silicon layer has been pre-selected to have the correct thickness for the MEMS device, the back silicon portion is largely removed by a grind and polish step, with the remaining portion, up to the silicon dioxide layer, removed by a chemical etch, such as tetramethylammonium hydroxide (TMAH). Next the silicon dioxide layer is removed in an HF etch. The silicon that remains would then have the desired thickness of the final MEMS device. If the original wafer 20 is a solid silicon wafer, then it must be carefully thinned to the desired thickness by a combination of physical grinding and polishing steps and chemical etching steps, taking care to maintain a uniform thickness across the entirety of the wafer. In each case, the alignment hole 23 is now visible.

Still referring to FIG. 5, the final fabrication step that will release the inner MEMS element 16 is the patterning of silicon wafer 20. First, photoresist members (34, 36, and 38) are formed on the exposed surface of the silicon wafer 20 by depositing the photoresist and patterning in accordance with standard photolithographic techniques. The photolithographic mask is aligned with alignment hole 23 to ensure that wafer 20 will be etched into the void 30 to release the inner MEMS element. It should be appreciated that a plurality of MEMS devices are fabricated from a single wafer and, as such, a plurality of alignment holes 23 exist and may be aligned to ensure that the mask is properly aligned both laterally and radially. The photoresist is then developed so as to form a pair of outer photoresist members 34 that are formed at the outer ends of the silicon wafer 20 and aligned with the spacers 29 to ultimately form the stationary outer MEMS element, as will become more apparent from the description below. A pair of middle photoresist members 36 are formed inwardly of outer pair 34 by distance $D_2$ that will ultimately define the variable size gap described above. An inner pair of photoresist members 38 is formed on the wafer 20, and spaced inwardly therefrom, such that the silicon disposed beneath photoresist 36 and 38 will ultimately define conductive structures on the movable MEMS element. The photoresist members 34, 36, and 38 are additionally aligned with the void 30 through use of the alignment holes such that the inner MEMS element will be released after the final etching step.

Figure 6:
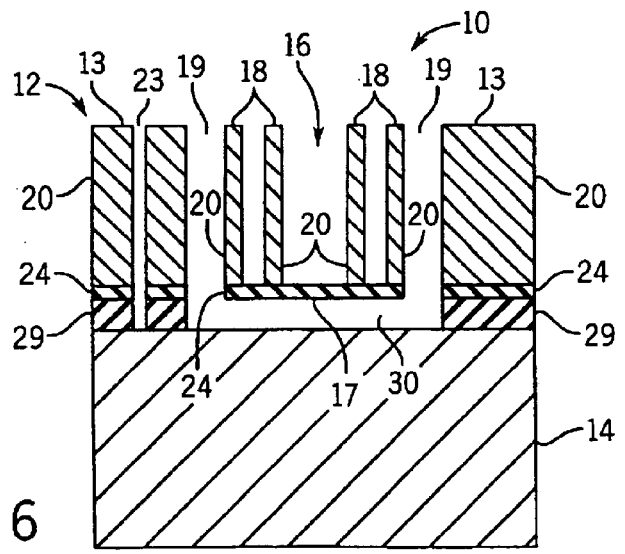
FIG. 6 is a sectional side elevation view of a MEMS device formed after selectively etching the wafer illustrated in FIG. 5 into the void and removing the photoresist.

With the photoresist 34, 36, and 38 in place, the silicon wafer 20 is anisotropically dry etched by a process commonly referred to as Deep Reactive Ion Etching (DRIE), which involves setting up a reactive etching environment in a suitably chosen gas by exciting with an inductively coupled plasma (ICP), as is understood by those having ordinary skill in the art. This etching process removes all silicon not disposed directly beneath one of the photoresist members to expose the pre-defined bridge 17 or the void. The MEMS structure has been released in this etch step. The photoresist 34, 36, and 38 is then removed to reveal the inner and outer pairs of conductive elements 18 that extend upwardly from the silicon dioxide layer 24, as shown in FIG. 6. Because the conductive elements 18 are aligned with the internal void 30, they will form part of the fabricated inner movable MEMS element 16, which has now been released from the substrate 14 as illustrated in FIG. 6. A third pair of oppositely disposed conductive elements 13 are formed, and are aligned with and are connected to the remaining spacers 29. Elements 13 are thus also connected to substrate 14 and will form part of the stationary conductive members 13 of the stationary MEMS element 12.

The inner movable MEMS element 16 comprises the plurality of the conductive elements 18 that are spaced from each other, and supported by the insulating silicon dioxide bridge 17 to provide electrical isolation for the device 12. The outermost conductive elements 18, comprising the silicon 20, silicon dioxide 24, and silicon nitride or polycrystalline silicon 29 layers, are separated from the corresponding stationary conductive elements 13 via the variable size gap 19 so as to output an electrical signal whose strength is dependent on the size of the gap in response to movement by the inner MEMS element 16, for example. Accordingly, the structure and electrical isolation achieved by MEMS device 10 renders the device suitable for applications such as current and voltage sensing.

It should be appreciated that the primary purpose of insulating layer 24 is to form the top of the internal void 30 and, subsequently, the bridge 17 of the inner movable MEMS element 16. Accordingly, it need not be present on the outer sections of the wafer 20 adjacent the middle section, but is deposited onto the entire wafer 20 during the deposition step. In this regard, it should be appreciated that the middle portion of layer 24 that remains after etching is isolated, in that it is either the only material from layer 24 that remains, or is separated from the remaining portion of layer 24. It should be appreciated that the outer conductive members 13 need not include the insulating layer 24.

It should be appreciated that, if layer 24 was not pre-etched in accordance with this embodiment, it would be etched into the void after the etching of silicon wafer 20 and thereby release the movable MEMS element 16. However, the stresses experienced by that portion of layer 24 that extends between the various members 18 prior to etching would be great enough so as to possibly cause layer 24 to fail, thereby rendering the structure unusable for its intended purpose. Regardless, it has been discovered that usable MEMS devices may be fabricated by etching layer 24 after the silicon wafer 20 to release the MEMS element 16.

Figure 7:
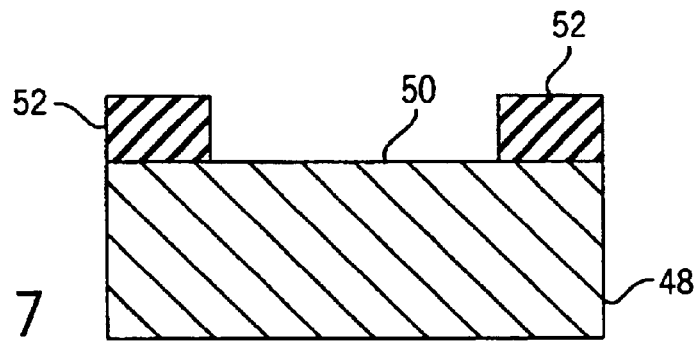
FIG. 7 is a sectional side elevation view of a wafer, showing patterned photoresist, used to construct a MEMS device in accordance with another embodiment of the invention.

Referring now to FIG. 7, a method of manufacturing the MEMS device 10 in accordance with another embodiment begins with a wafer 48, which preferably comprises silicon, or an SOI waver, as described above. A pair of outer photoresist members 52 is formed on the upper surface 50 of the wafer 48, and the wafer is subsequently anisotropically dry etched in an inductively coupled plasma (ICP). It should be appreciated that the width of each photoresist member 52 will define the corresponding width of the spacers, and consequently the width of the fabricated stationary conductive MEMS elements 13, as will become more apparent from the description below.

Figure 8:
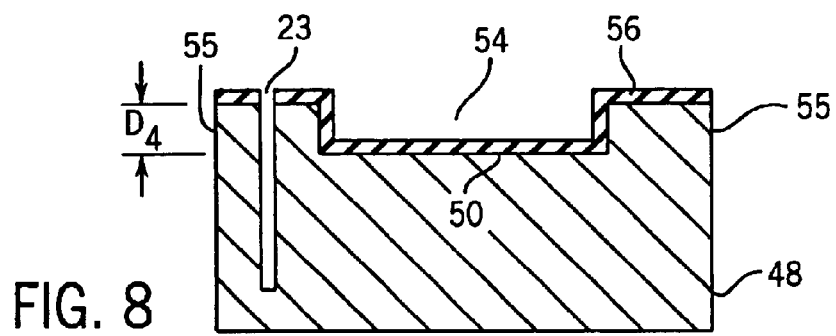
FIG. 8 is a sectional side elevation view of the structure illustrated in FIG. 7 after selectively etching the wafer, removing the photoresist, and depositing a bridge layer and patterning and etching an alignment hole into the wafer.

The middle portion of wafer 48 is partially etched for a predetermined amount of time sufficient to produce an outer pair of spacers 55 having a recess 54 therebetween of a depth $D_4$ (shown in FIG. 8). The etchant and then the photoresist 52 are subsequently removed once the recess 54 has achieved a sufficient depth. Depth $D_4$ should be sufficiently large to produce an internal void, once the wafer is bonded to the substrate 14, that will enable the movable MEMS element 16 to be subsequently released from the substrate 14 and to move freely, as will be described in more detail below. It should be appreciated that the thickness of the final MEMS structure is the original thickness of the SOI wafer minus $D_4$. Accordingly, $D_4$ is controlled to determine the final thickness of the fabricated MEMS device 10.

Referring now to FIG. 8, layer 56, which is insulating in accordance with this embodiment, is applied to the upper surface 50 of the wafer. The insulating properties of layer 56 will provide the electrical isolation for the fabricated MEMS device 10. The layer 56 preferably comprises silicon dioxide, but could alternatively comprise a selectively etchable material having suitable properties, such as silicon nitride, for example. The layer 56 may be formed using a standard oxidation process in which the wafer 48 is exposed to elevated temperatures in an oxygen atmosphere for a predetermined period of time. Alternatively, the layer 56 may be deposited using chemical vapor deposition or plasma enhanced chemical vapor deposition, which would be preferable if it is desirable to reduce the temperatures experienced by the wafer 48. It is appreciated that the layer 56 is continuous within the recess 54, as this portion of the layer will ultimately define the base 17 of the inner movable MEMS element 16.

In accordance with the illustrated embodiment, the spacers 55 comprise the portion of the unetched silicon at both outer ends of the wafer 48. The insulating layer 56 provides enhanced electrical isolation for the MEMS device 10, for example when the substrate is a conductor. For the purposes of clarity and convenience, spacers 55, as used herein, will include layer 56 throughout this description, it being appreciated that layer 56 need not form part of spacers 55. An alignment hole 23 is additionally formed in one of the spacers 55 and extends into the bulk of the wafer for alignment purposes, as described above.

Figure 9:
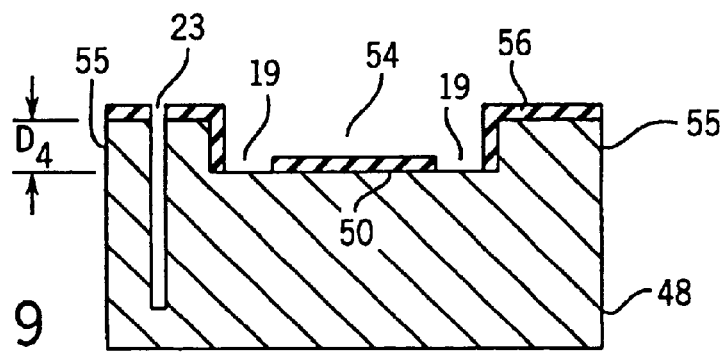
FIG. 9 is a sectional side elevation view of the wafer illustrated in FIG. 8 after selectively etching the bridge layer.

Next, referring to FIG. 9, photoresist (not shown) is applied to layer 56 and patterned, and a portion of layer 56 is anisotropically etched. In particular, insulating material is removed to form two gaps 19 disposed on either side of a substantially centrally disposed remaining portion of insulating layer 56 and adjacent spacers 55. Gap 19 will ultimately define the variable size gap as described above. While layer 56 is patterned such that insulating material remains on spacers 55, it should easily be appreciated that this portion of the layer could be removed as well. The photoresist is subsequently removed to reveal an active portion of layer 56 that will ultimately form bridge 17 for the fabricated movable MEMS element 16.

Figure 10:
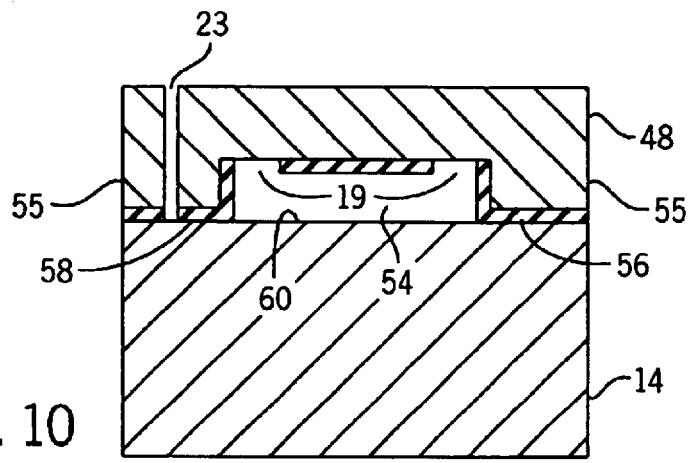
FIG. 10 is a sectional side elevation view of the wafer illustrated FIG. 9 bonded to a substrate to form a composite structure having an internal void and thinning the wafer.

Referring to FIG. 10, the upper surfaces 58 of spacers 55 are bonded to the upper surface 60 of substrate 14 using a high temperature fusion bonding process, an anodic bonding process, or any equivalent process, as described above. Accordingly, the recess 54 becomes an internal void that is further defined by the upper surface 60 of the substrate 14. The portion of wafer 48 that is aligned with the remaining middle portion of layer 56 will ultimately define the movable MEMS element 16, while the portion of the wafer 48 that is aligned with the spacers 55 will ultimately comprise the stationary conductive elements 13, as will now be described.

Wafer 48 is then thinned to the desired thickness of the final MEMS device 10. If the wafer 48 is an SOI wafer, where the top silicon layer is the correct thickness for the MEMS device, the back silicon portion is largely removed by a grind and polish step, with the remaining portion, up to the silicon dioxide layer, removed by a chemical etch, such as TMAH. Next the silicon dioxide layer is removed in an HF etch. The remaining silicon is now the desired thickness of the final MEMS device. If the original wafer 48 is a solid silicon wafer, then it must be carefully thinned to the desired thickness by a combination of physical grinding and polishing steps and chemical etching steps, taking care to maintain a uniform thickness across the entirety of the wafer.

Figure 11:
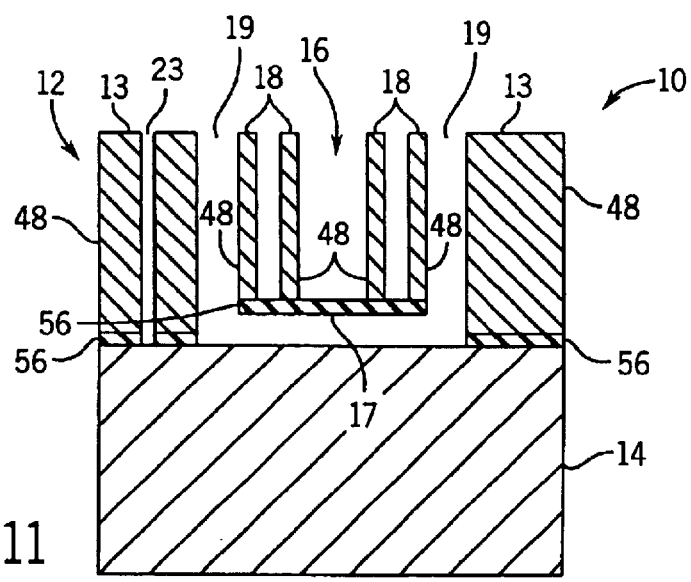
FIG. 11 is a sectional side elevation view of a MEMS device formed after selectively etching the wafer illustrated in FIG. 10.

Next, referring to FIG. 11, photoresist is applied and patterned to the silicon wafer 48, using the alignment hole 23 to align the photoresist mask. The silicon wafer 48 is then anisotropically etched through to the gap 19. Accordingly, a pair of outer conductive elements 13 are formed along with inner conductive elements 18, which are supported by layer 56 and gap 55. Additionally, the inner MEMS element 16 is released from the substrate. The inner movable MEMS element 16 comprises the plurality of the conductive elements 18 spaced apart from one another, and connected via the insulating silicon dioxide base 17 to provide electrical isolation in accordance with the preferred embodiment. The outermost conductive elements 18, comprising the silicon 48 and silicon dioxide 56, are separated from the corresponding stationary conductive elements 13 via the variable size gap 19 so as to output an electrical signal whose strength is dependent on the size of the gap in response to movement by the inner MEMS element 16, for example.

Figure 12:
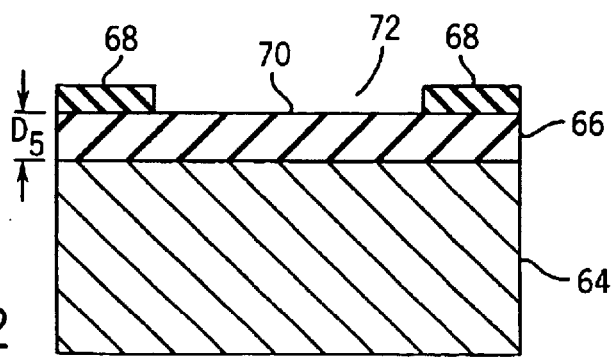
FIG. 12 is a sectional side elevation view of a wafer having a first separating layer deposited thereon, and having photoresist deposited and patterned thereon, and used to construct a MEMS device in accordance with another embodiment of the invention.

Referring now to FIG. 12, a method of manufacturing the MEMS device 10 in accordance with another embodiment is presented that avoids the difficulties associated with partially etching the silicon material to form the recess in the wafer. In particular, a silicon wafer 64 has deposited thereon a first layer 66, which is insulating if the MEMS device 10 will be used in applications requiring electrical isolation. In accordance with the preferred embodiment, the layer comprises silicon dioxide because it is easily selectively etchable, it being appreciated that layer 66 could alternatively comprise any other selectively etchable material, such as silicon nitride. The thickness $D_5$ of layer 66 will define the depth of the recess and corresponding internal void, and should be sufficiently deep so as to facilitate the release of the inner movable MEMS element from the substrate. Photoresist members 68 are formed on the outer ends of the upper surface 70 of layer 66 whose width will, as described above, correspond to the width of the fabricated spacers.

Figure 13:
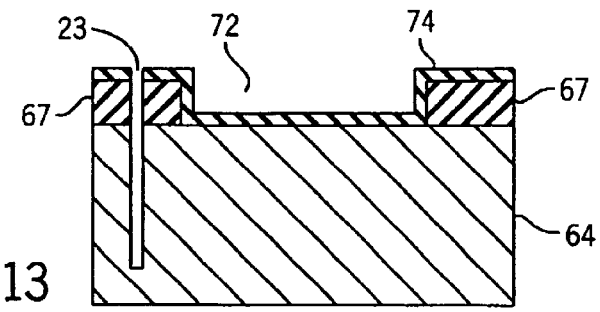
FIG. 13 is a sectional side elevation view of the wafer illustrated in FIG. 12 after selectively etching the first separating layer, removing the photoresist, and depositing a second bridge layer thereon and patterning and etching an alignment hole into the wafer.

Referring now to FIG. 13, layer 66 is etched, and the photoresist 68 is removed, to reveal an outer pair of spacers 67 defining a recess 72 disposed therebetween. A second layer 74, which in the preferred embodiment comprises an insulator such as silicon dioxide, is deposited onto the wafer 64 and spacers 67. It should be appreciated that the middle portion of layer 74 will ultimately define the bridge for the movable MEMS element 16.

It should be appreciated that while both layers 66 and 74 are formed from the same material in accordance with this embodiment, such an arrangement is feasible because the layers are not selectively etched with respect to one another. Rather, both layers 66 and 74 will be selectively etched with respect to the silicon wafer 64, as will be described in more detail below.

Figure 14:
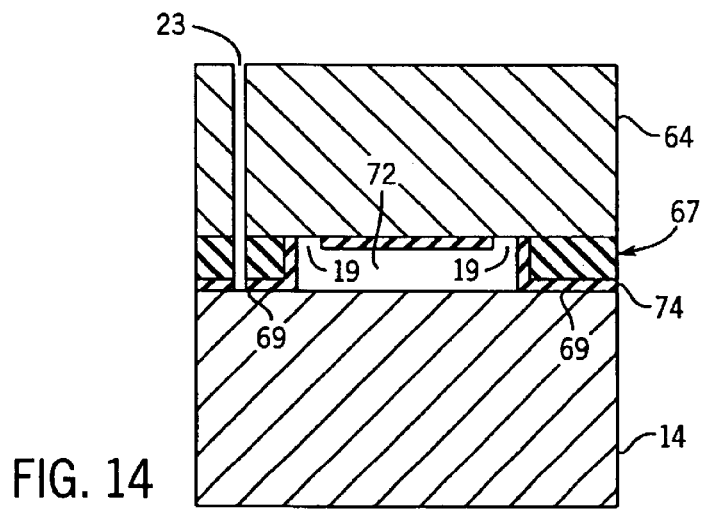
FIG. 14 is a sectional side elevation view of the wafer illustrated in FIG. 13 after selectively etching the bridge layer, bonding the wafer to the substrate and thinning the wafer to form a composite structure having an internal void.
Figure 15:
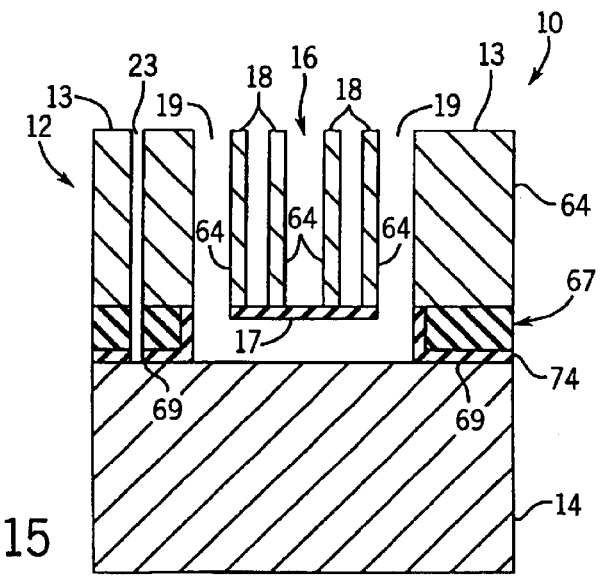
FIG. 15 is a sectional side elevation view of a MEMS device after selectively etching the wafer of the composite structure illustrated in FIG. 14 into the void.

Referring now to FIG. 14, layer 74 is etched to produce a middle portion separated from spacers 67 by gaps 19, as described above. Also the alignment hole 23 is patterned and etched into the wafer, as described above. Next, the upper surfaces 69 of spacers 67 are bonded to the upper surface of the insulating substrate 14. The wafer 64 is then thinned, patterned, and etched to produce the outer stationary conductive elements 13 and inner movable conductive elements 18. Finally, the wafer 64 is etched into the gap 19 to release the movable conductive elements 18, which are supported by bridge 17, from the substrate 14. Stationary conductive elements 13 are also produced, which are connected to the substrate 14 and separated from the movable element 16 via variable size gap 19, as depicted in FIG. 15.

Figure 16:
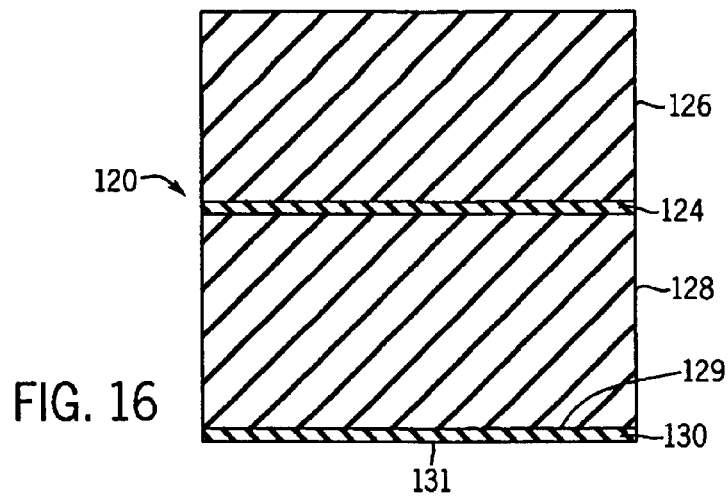
FIG. 16 is a schematic sectional side elevation view of an SOI wafer used to fabricate a MEMS structure in accordance with another embodiment.

Another embodiment of the invention, in which a recessed substrate provides the void for subsequent release of the inner MEMS element will now be described with initial reference to FIG. 16. In particular, an SOI wafer 120 includes a layer of silicon 128 and a silicon wafer 126, that are separated by a first layer of nonconductive silicon dioxide 124. SOI wafers are commercially available having various silicon layer thicknesses, and are thus selected in anticipation of the height of the final MEMS device. It should be appreciated that SOI wafers are commercially available having thicknesses for layer 128 of between 1 and 100 microns. The thickness of layer 126 may vary between, for example, 350 and 750 microns, and can depend on the diameter of the wafer. Such SOI wafers are commercially available, for example, from Shin-Etsu Handotai Co., Ltd., located in Japan. As will become more apparent from the description below, the thickness of layer 128 will ultimately define the thickness of the resulting MEMS structure.

An insulating layer 130 of, for example, silicon dioxide is grown or deposited on the lower surface 129 of the silicon layer 128, for example by using a plasma enhanced chemical vapor deposition process (PECVD) as is understood by those having ordinary skill in the art. Alternatively, layer 130 could comprise silicon nitride. The silicon dioxide layer is added in accordance with the preferred embodiment to facilitate a mechanical connection that is electrically isolating between different portions of the final MEMS structure.

Figure 17:
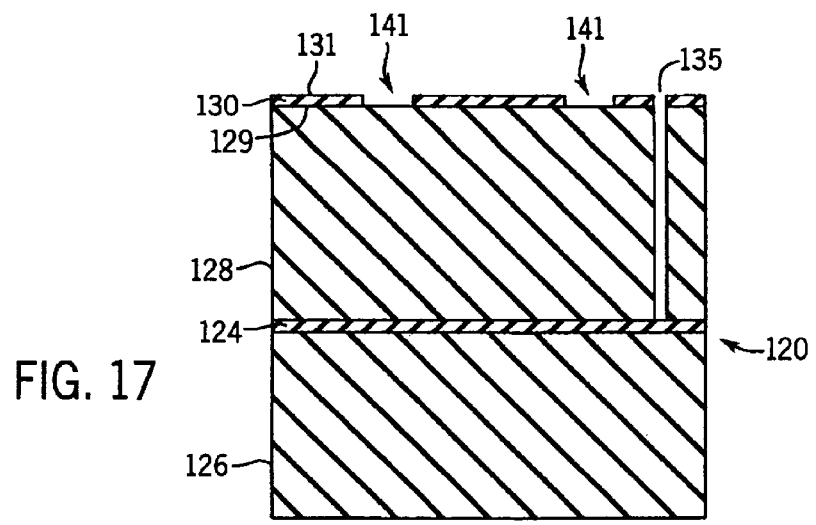
FIG. 17 is a sectional side elevation view of the wafer illustrated in FIG. 16 after pre-patterning the outer silicon dioxide layer and patterning and etching an alignment hole into the wafer.

Referring now to FIG. 17, the insulating layer 130 is patterned and etched in the manner described above to produce a central portion set apart from two outer portions by a gap 141. As described above, the outer portions of layer 130 may also be etched to leave only the material that will ultimately form the bridge of the movable MEMS element remaining. However, the outer portions of layer 130 remain in accordance with the preferred embodiment, and define the geometry of the stationary conductive elements that are to be subsequently fabricated. Additionally, the outer portions, when bonded to the substrate 122, provide sufficient clearance between the substrate and the bridge during operation.

The isolated inner portion of layer 130 will be aligned with an internal void to facilitate the release of the movable MEMS element, as will be described in more detail below. In addition, an alignment hole 135 is etched through layers 130 and 128 as described above. Layer 124 serves as a natural etch stop. Layers 126 and 124 will be removed revealing the alignment hole prior to using it.

Figure 18:
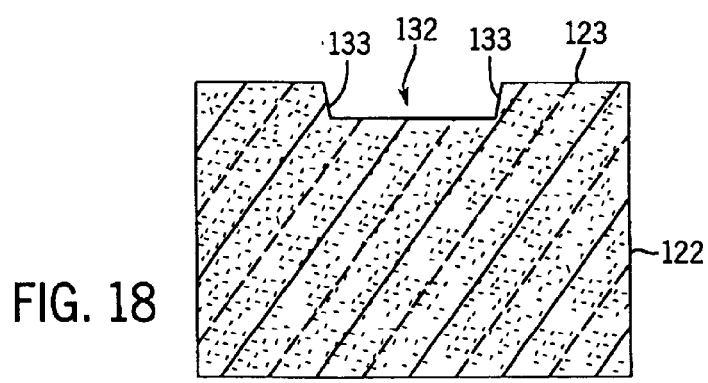
FIG. 18 is a sectional side elevation view of a substrate after etching a recess into its upper surface.

In particular, referring to FIG. 18, a recess 132 is formed in the upper surface 123 of the substrate 122 by placing photoresist on the substrate and patterning it with standard photolithographic techniques as is understood by those having ordinary skill in the art. The recess is centrally disposed in the substrate 122 and is wider than the middle portion of layer 130 such that the movable MEMS element will be released from the substrate when the wafer 120 is etched into the void, as will be described in more detail below. To form the recess 132 in the middle portion of the upper surface 123 of the substrate 122, the photoresist is patterned to remain on the outer portions of the upper surface, and the substrate 122 is etched using a plasma etch or wet chemistry etch suitable for the material composition of the substrate, as is understood by those having ordinary skill in the art. It should be appreciated that, in commercial production, it is envisioned that multiple MEMS structures will be fabricated from a single wafer, and that photoresist in such embodiments is patterned in accordance with the present invention by providing gaps therebetween, wherein the gaps will ultimately define the recesses 132 in the wafer.

The photoresist is removed to reveal the recess 132 having beveled side walls 133. While the recess 132 is shown as being isotropically etched in the figures, thereby producing the beveled walls 133, it should be appreciated that an anisotropic etching process (for example, using an anisotropic etching plasma) could alternatively be used, which would produce side walls that are substantially perpendicular to the upper surface 123 of the substrate 122. The recess 132 is chosen to be sufficiently deep so as to enable the MEMS structure to release from the substrate 122 after fabrication, as will be described in more detail below.

Figure 19:
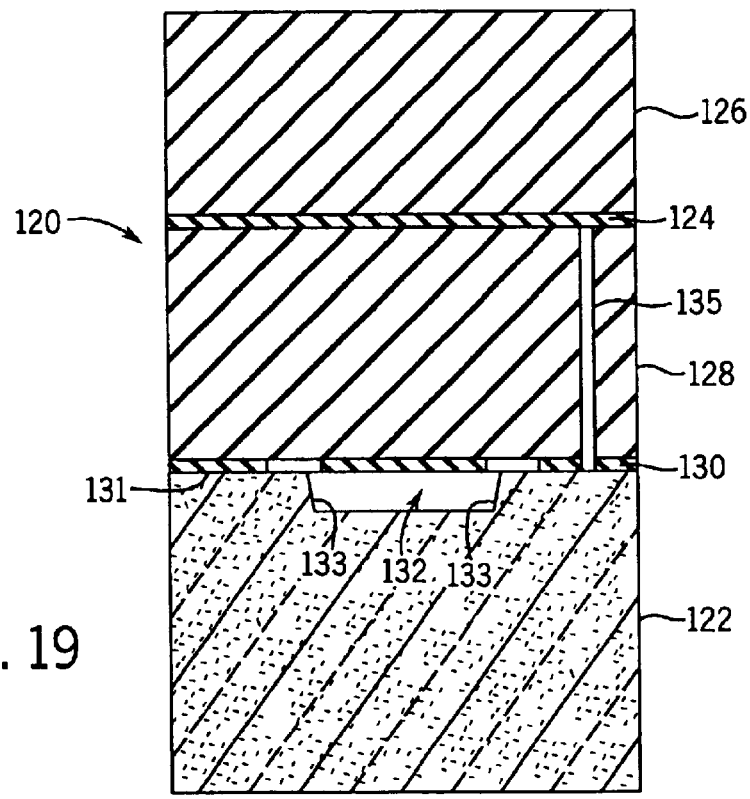
FIG. 19 is a sectional side elevation view of the wafer illustrated in FIG. 17 connected to the substrate illustrated in FIG. 18 to form a composite structure having an internal void formed therein.

Referring now to FIG. 19, the bottom surface 131 of the silicon dioxide layer 130 is bonded to the upper surface 123 of the substrate 122 such that inner portion of layer 130 is aligned with the void 132. In particular, the wafer 120 is positioned above the insulating substrate 122, and is bonded thereto via, for example, a high temperature fusion bonding process, an anodic bonding process, or any other suitable process as understood by those having ordinary skill in the art. Because the wafer 120 does not need to be bonded to the substrate 122 using a layer that will need to be undercut in a subsequent procedure, as in prior art fabrication methods, the bond will not be sensitive to temperature elevations that may occur at later stages of the fabrication process. It should be appreciated that, depending on the material chosen for the substrate 122, it may be desirable to grow or deposit an oxide layer onto the upper surface 123 thereof prior to the bonding step in order to provide a suitable layer to bond with the lower surface 131 of the insulating layer 130.

Figure 20:
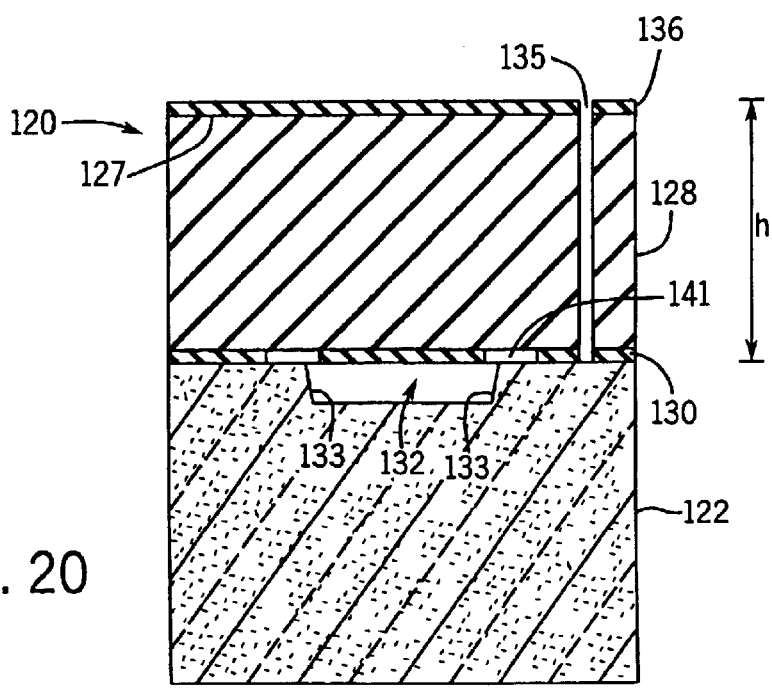
FIG. 20 is a sectional side elevation view of the structure illustrated in FIG. 19 after removing a silicon and insulating layer and depositing a conductive layer.

Referring also now to FIG. 20, the relatively thick silicon base layer 126 is mostly removed by a grinding and polishing process, and is finished by subsequently etching in tetramethylammonium hydroxide (TMAH) to expose silicon dioxide layer 124. In this regard, layer 124 provides an easily controlled etch stop when removing layer 126 as it is not etched by TMAH. The oxide layer 124 is then removed by etching with hydrofluoric acid to reveal an upper surface 127 of the silicon layer 128. The layer 28 remains having the desired uniform thickness, it being appreciated that the final height h of the wafer 120 will correspond generally to the desired height of the resulting fabricated MEMS structure, as will become more apparent from the description below. At this point, the alignment hole is now visible.

The same desired structure can also be obtained without the use of an SOI wafer, but with a simple silicon wafer instead. As described above, wafer 120 could comprise silicon, silicon carbide, or gallium arsenide. If the wafer 120 is not an SOI wafer, it would be ground and polished to the desired thickness after bonding. The use of commercially available SOI wafers facilitates the attainment of the desired silicon thickness. Also, additional silicon from layer 128 may be removed from the SOI wafer 120, if so desired, by grinding and polishing.

Next, a conductive layer 136, such as aluminum, may be deposited onto the upper surface 127 either by evaporation or sputtering, or any suitable alternative process, as is well known in the art. It should be appreciated that the conductive layer could alternatively comprise copper, silver, gold and nickel. The conductive aluminum layer 136 will eventually form the electrical contact for the MEMS structure after the fabrication process has been completed, as will become more apparent from the description below. Alternative suitable conductors may be deposited besides aluminum, such as copper, silver, gold or nickel, or a highly doped semiconductor material such as silicon, silicon carbide, and gallium arsenide, or any other suitable conductive metal that is compatible with the fabrication processes of the present invention. It should be appreciated in this regard that layer 136 could be used with any embodiment in accordance with the present invention to provide an electrical connection. Likewise, the wafer level cap described above could alternatively be used in accordance with the present invention.

Figure 21:
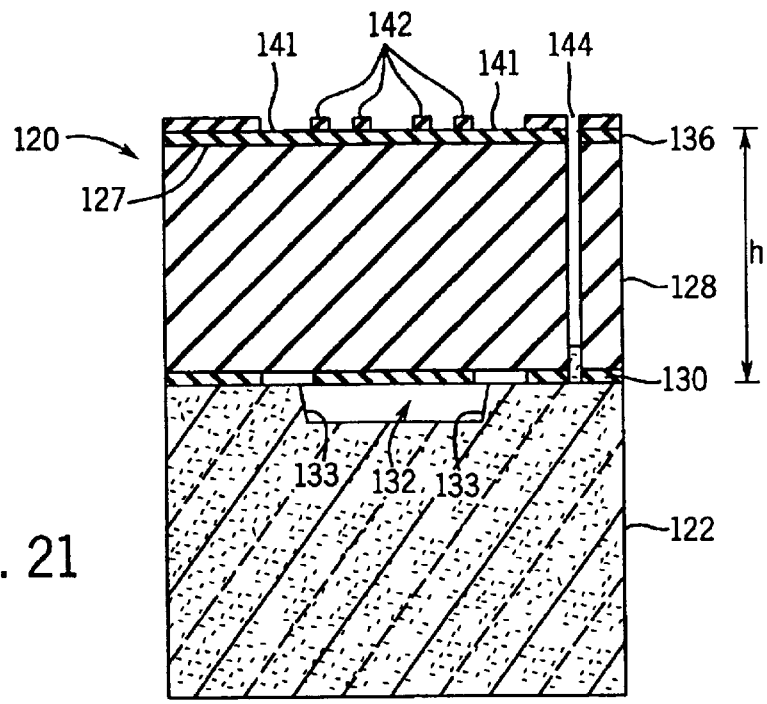
FIG. 21 is a sectional side elevation view of the structure illustrated in FIG. 20 after applying photoresist to the conductive layer.

Referring to FIG. 21, photoresist is applied and patterned by standard photolithographic techniques to provide a pattern for etching through both the aluminum and silicon layers 136 and 128. It should be appreciated that some photoresist and aluminum may spill into alignment hole 135 with no adverse effects so long as the hole remains visible to properly align the photolithographic mask on the wafer. Once the desired layers are in place, they are etched so as to form the MEMS structure in accordance with the preferred embodiment. In particular, the etching process of the wafer 120 begins by depositing a photoresist layer and patterning by standard photolithographic techniques to leave inner and outer photoresist members 142 and 144, respectively, having a gap 141 disposed therebetween that is at least partially aligned with void 132. The photoresist mask is properly aligned using alignment hole 135, as described above.

Next, the aluminum layer 136 is etched, for example, by using an anisotropic etching plasma that selectively etches aluminum, and that does not react to either silicon dioxide or silicon. A chlorine plasma has been found to be suitable for anisotropically dry etching the aluminum layer 136 in accordance with the preferred embodiment. Because the plasma does not react with silicon, the resulting etched aluminum structures 136 define the structure for etching the silicon layer 128, as will now be described with reference to FIG. 22.

Figure 22:
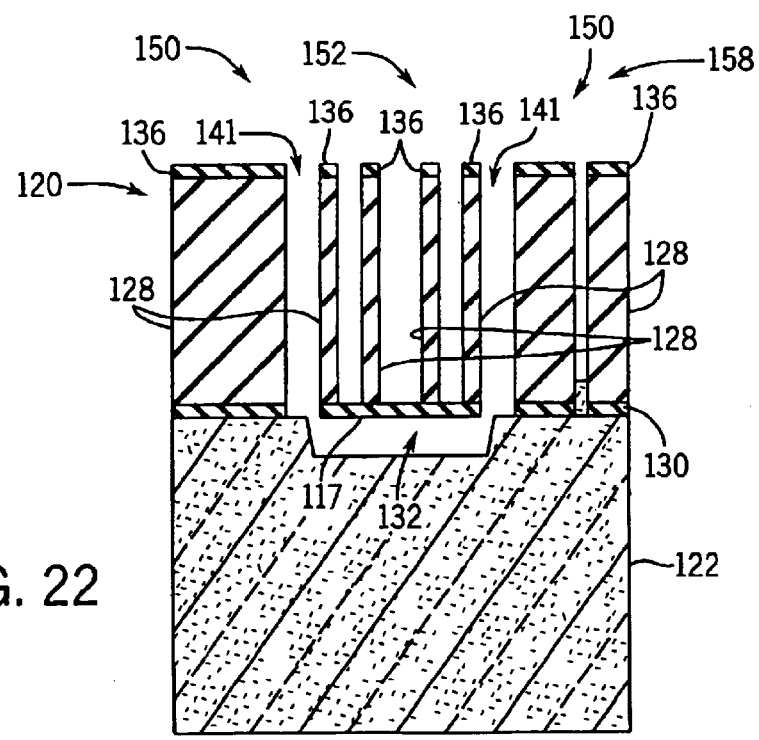
FIG. 22 is a sectional side elevation view of the structure illustrated in FIG. 21 after etching through the conductive and silicon layers into the void to release the movable MEMS element.

Referring now to FIG. 22, the silicon layer 128 is anisotropically dry etched by a process commonly referred to as Deep Reactive Ion Etching (DRIE), which involves setting up a reactive etching environment in a suitably chosen gas by exciting with an inductively coupled plasma (ICP), as is understood by those having ordinary skill in the art. The photoresist mask is removed at this time. This final etching step releases the structure and produces a pair of stationary outer structures 150 that define a stationary conductive MEMS element 150, and an inner set of conductive structures 128 supported by a bridge 117 at their base that define a movable MEMS element 152. Conductive and movable MEMS elements 150 and 152, respectively, are separated by variable size gap 141.

It should be appreciated that a silicon dioxide layer (not shown) could alternatively be deposited onto the upper surface of the aluminum layer 136 to provide protection for the aluminum layer 136 and to provide a mask for future etching of the aluminum and silicon. Because this layer would only be used to provide a mask to etch the substrate 128 and aluminum layer 136, the layer could be subsequently removed, such that the resulting MEMS structure 158 has the same composition whether or not this optional layer is used.

The final MEMS structure 158 therefore includes stationary outer MEMS elements 150, and an inner movable MEMS element 152. It should be appreciated, however, that wafer 120 could alternatively be etched in accordance with the present invention to produce any MEMS structure having a suitable configuration that facilitates the release of a movable MEMS element. The outer and inner MEMS elements 150 and 152 include a silicon layer 128 separated from each other and the substrate 122 by a non-conductive layer of silicon dioxide 130, thereby providing electrical isolation on the order of 50 volts, if a conductive substrate 122 is utilized. If however a non-conductive substrate, such a glass, is utilized, electrical isolation on the order of 2000 volts may be achieved. A conductive layer of aluminum 136 is disposed above the silicon layer. In accordance with the preferred embodiment, a wire may be connected to the aluminum layers 136 of the stationary MEMS elements 153 to place the stationary elements in electrical communication with the ambient environment and render the device 158 operable.

The preferred embodiment of the invention could thus be implemented to form a MEMS structure incorporating a wafer level cap, having electrical leads extending from the base of conductive elements 150 to the ambient environment outside the cap, as described above.

The MEMS structure 158 could therefore perform any function suitable for a MEMS application. For example, the device 158 could comprise an accelerometer whose movable MEMS element 152 is a cantilever beam that deflects in response to an external stimulus, such as an acceleration or vibration of the device 158. Accordingly, as the size of the gap between the stationary conductive elements 150 and the movable MEMS element 152 varies, so will the output capacitance, thereby providing a measurement of the amount of deflection of the movable MEMS element 152. A measurement of the strength of an external stimulus may thereby be obtained.

The above has been described as a preferred embodiment of the present invention. It will occur to those that practice the art that many modifications may be made without departing from the spirit and scope of the invention. For example, while the various layers are described as being made of silicon, silicon dioxide, and aluminum, any other suitable compositions could be used that have the desired conductive or insulating properties. In order to apprise the public of the various embodiments that may fall within the scope of the invention, the following claims are made.

We claim:

1. A method of fabricating a MEMS structure, comprising the steps of:
   (a) providing a wafer having at least a first insulating layer and a second layer;
   (b) removing a portion of the first layer through to the second layer to form a bridge member from the first layer;
   (c) providing a substrate defining an upper surface, wherein a recess is formed in at least one of the substrate and the wafer;
   (d) after step (c), attaching the wafer to the upper surface of the substrate to form a composite structure having an internal void formed therein, wherein the bridge member is aligned with the internal void, and
   (e) etching through the second layer of the wafer around the periphery of the bridge member to break through into the void and release the bridge from the substrate.

2. The method as recited in claim 1, further comprising depositing a conductive layer onto the wafer.

3. The method as recited in claim 2, wherein the conductive layer is selected from the group consisting of aluminum, copper, silver, gold and nickel.

4. The method as recited in claim 1, wherein the wafer is selected from the group consisting of silicon, silicon carbide and gallium arsenide.

5. The method as recited in claim 1, wherein the substrate is a non-conductive substrate selected from the group consisting of glass, high resistivity silicon, crystalline sapphire, and ceramic.

6. The method as recited in claim 1, wherein the substrate is a conductive substrate selected from the group consisting of silicon, silicon carbide, and gallium arsenide.

7. The method as recited in claim 1, wherein the recess has beveled edges.

8. The method as recited in claim 1, wherein the bridge member comprises silicon dioxide.

9. The method as recited in claim 1, further comprising etching an alignment hole into the wafer.

10. The method as recited in claim 9, further comprising thinning the wafer such that the alignment hole extends entirely through the wafer.

11. The method as recited in claim 1, wherein step (d) further comprises forming a stationary conductive member extending from the substrate that is separated from the bridge via a variable size gap.

12. The method as recited in claim 1, wherein step (d) further comprises at least partially defining the void with at least one surface of the substrate.

13. The method as recited in claim 1, wherein step (c) further comprises etching into the upper surface of the substrate to form the recess.

14. The method as recited in claim 1, wherein step (d) further comprises placing the bridge between the surface and the second layer.

15. The method as recited in claim 1, step (c) further comprises forming recess in a surface of the wafer.

16. The method as recited in claim 15, wherein step (c) further comprises pre-patterning the surface of the wafer to form the recess.

17. The method as recited in claim 15, wherein step (b) further comprises partially etching into a surface of the wafer to form the pair of spacers.

18. The method as recited in claim 15, wherein step (c) further comprises forming a pair of spacers at opposing ends of the surface of the wafer such that the spacers define the recess therebetween.

19. The method as recited in claim 18, wherein step (a) further comprises depositing the first insulating layer onto the second layer between the spacers.

20. The method as recited in claim 19, wherein the deposited layer comprises silicon dioxide.

21. The method as recited in claim 1, wherein step (c) further comprises pre-patterning a recess into the upper surface of the substrate.

22. A method of fabricating a MEMS structure, comprising the steps of:
   (a) providing a wafer having at least a first layer and a second layer;
   (b) removing a portion of the first layer to form a bridge member;
   (c) providing a substrate, wherein a recess is formed in at least one of the substrate and the wafer;
   (d) after step (c), attaching the wafer to a substrate to form a composite structure having an internal void formed therein, wherein the bridge member is aligned with the internal void; and
   (e) etching through the second layer of the wafer around the periphery of the bridge member to 1) break through into the void, 2) release the bridge from the substrate, 3) form a conductive member extending from the bridge, and 4) form a stationary member from the wafer that is separated from the bridge member by a gap that varies in size in response to bridge member movement.

23. The method as recited in claim 22, further comprising depositing a conductive layer onto the wafer.

24. The method as recited in claim 23, wherein the conductive layer is selected from the group consisting of aluminum, copper, silver, gold and nickel.

25. The method as recited in claim 22, wherein the wafer is selected from the group consisting of silicon, silicon carbide and gallium arsenide.

26. The method as recited in claim 22, wherein the substrate is a non-conductive substrate selected from the group consisting of glass, high resistivity silicon, crystalline sapphire, and ceramic.

27. The method as recited in claim 22, wherein the substrate is a conductive substrate selected from the group consisting of silicon, silicon carbide, and gallium arsenide.

28. The method as recited in claim 22, wherein the void is formed by pre-patterning a recess into a surface of the wafer prior to step (c), and bonding the surface to the substrate.

29. The method as recited in claim 22, wherein the void is formed by pre-patterning a recess into a surface of the substrate prior to step (c), and bonding the surface to the wafer.

30. The method as recited in claim 22, wherein the recess has beveled edges.

31. The method as recited in claim 22, wherein the bridge member comprises an insulating material.

32. The method as recited in claim 31, wherein the bridge member comprises silicon dioxide.

33. The method as recited in claim 22, further comprising etching an alignment hole into the wafer.

34. The method as recited in claim 33, further comprising thinning the wafer such that the alignment hole extends entirely through the wafer.

35. The method as recited in claim 22, wherein step (e) further comprises forming the stationary member extending outwardly from the substrate.

36. The method as recited in claim 22, wherein the conductive member and stationary member are electrically isolated from one another.

37. The method as recited in claim 22, wherein step (c) further comprises forming a pair of spacers at opposite ends of a surface of the wafer.

38. A method of fabricating a MEMS structure, comprising the steps of:
   (a) providing a wafer;
   (b) partially etching into a surface of the wafer to form a recess therein disposed between a pair of spacers;
   (c) depositing a layer onto the surface of the wafer in the recess to form a bridge;
   (d) attaching the spacers to a substrate to define an internal void; and
   (e) etching through the wafer into the void around the periphery of the bridge to release the bridge from mechanical communication with the substrate and to produce a stationary conductive MEMS element attached to the substrate, and a movable conductive MEMS element supported by the bridge and separated by the stationary element via a variable size gap.

39. The method as recited in claim 38, wherein the layer is insulating.

40. The method as recited in claim 39, wherein the layer comprises silicon dioxide.

41. The method as recited in claim 38, further comprising depositing a conductive layer onto the wafer.

* * * * *